United States Patent
Huang et al.

(10) Patent No.: US 10,979,520 B2
(45) Date of Patent: Apr. 13, 2021

(54) DATA TRANSMISSION METHOD AND APPARATUS

(71) Applicant: HUAWEI TECHNOLOGIES CO., LTD., Guangdong (CN)

(72) Inventors: Lin Huang, Beijing (CN); Chuanting Wang, Beijing (CN)

(73) Assignee: HUAWEI TECHNOLOGIES CO., LTD., Guangdong (CN)

(*) Notice: Subject to any disclaimer, the term of this patent is extended or adjusted under 35 U.S.C. 154(b) by 94 days.

(21) Appl. No.: 15/979,951

(22) Filed: May 15, 2018

(65) Prior Publication Data
US 2018/0262590 A1    Sep. 13, 2018

Related U.S. Application Data

(63) Continuation of application No. PCT/CN2016/103615, filed on Oct. 27, 2016.

(30) Foreign Application Priority Data

Nov. 16, 2015    (CN) .......................... 201510785464.2

(51) Int. Cl.
*H04L 29/08* (2006.01)
*G06F 16/27* (2019.01)
(Continued)

(52) U.S. Cl.
CPC .......... *H04L 67/2828* (2013.01); *G06F 16/00* (2019.01); *G06F 16/245* (2019.01);
(Continued)

(58) Field of Classification Search
CPC ........ G06F 16/00; G06F 16/245; G06F 16/27; H03M 7/30; H03M 7/46; H03M 7/607; H03M 7/6088; H04L 67/2828
See application file for complete search history.

(56) References Cited

U.S. PATENT DOCUMENTS 7,103,608 B1 * 9/2006 Ozbutun ........... G06F 16/24557
                                                    707/604
7,451,237 B2 * 11/2008 Takekawa ............... H04L 69/04
                                                    382/239
(Continued)

FOREIGN PATENT DOCUMENTS

CN    1666196 A    9/2005
CN    102356553 A  2/2012
(Continued)

OTHER PUBLICATIONS

"Relational database", Wikipedia, Nov. 9, 2015, XP002786068, 8 pages.
(Continued)

*Primary Examiner* — Joe Chacko
(74) *Attorney, Agent, or Firm* — Womble Bond Dickinson (US) LLP

(57) ABSTRACT

Embodiments of the present invention relate to the database field, and in particular, to a data transmission method and apparatus, so as to reduce overheads for data transmission between nodes in a distributed database and lighten network load. In the embodiments of the present invention, a DN determines a column that has a distribution rule of parameters in the column; the DN determines, according to a data type of the parameters of the column and the distribution rule of the parameters in the column, a compression algorithm corresponding to the column; the DN compresses the column using the compression algorithm; and the DN sends a compressed column to a target node. In this way, the overheads for the data transmission between the nodes are reduced, and the network load is lightened.

11 Claims, 4 Drawing Sheets

(51) Int. Cl.
  *G06F 16/245* (2019.01)
  *H03M 7/30* (2006.01)
  *G06F 16/00* (2019.01)
  *H03M 7/46* (2006.01)
(52) U.S. Cl.
  CPC .............. *G06F 16/27* (2019.01); *H03M 7/30* (2013.01); *H03M 7/46* (2013.01); *H03M 7/607* (2013.01); *H03M 7/6088* (2013.01)

(56) References Cited

U.S. PATENT DOCUMENTS

| | | | | |
|---|---|---|---|---|
| 2008/0320151 | A1 | 12/2008 | McCanne et al. | |
| 2009/0187586 | A1* | 7/2009 | Olson ..................... | H03M 7/30 |
| 2012/0001777 | A1* | 1/2012 | Litvak ..................... | H03M 7/30 |
| | | | | 341/87 |
| 2012/0316691 | A1* | 12/2012 | Boardman ................ | H02J 3/26 |
| | | | | 700/293 |
| 2014/0145866 | A1 | 5/2014 | Lee et al. | |
| 2015/0100556 | A1* | 4/2015 | Sekiguchi ............... | H03M 7/30 |
| | | | | 707/693 |

FOREIGN PATENT DOCUMENTS

| | | | |
|---|---|---|---|
| CN | 102521363 | A | 6/2012 |
| CN | 102638579 | A | 8/2012 |
| CN | 103003813 | A | 3/2013 |
| CN | 103326732 | A | 9/2013 |
| CN | 103729429 | A | 4/2014 |
| CN | 103778203 | A | 5/2014 |
| CN | 104348490 | A | 2/2015 |
| CN | 104753539 | A | 7/2015 |
| EP | 1504377 | B1 | 6/2011 |
| EP | 2556446 | B1 | 12/2018 |
| JP | 2002007441 | A | 1/2002 |
| WO | 2010109456 | A1 | 9/2010 |

OTHER PUBLICATIONS

"Run-length encoding", Wikipedia, Sep. 20, 2015, XP002786069, 4 pages.
"Possible to compress SQL Server network traffic?", Internet article, Oct. 16, 2010, XP002786070, 2 pages.
"Is data retrieved from SQL Server compressed for transmission?", Internet article, 2013 .XP002786071, 4 pages.
"toonel .net, Other TCP/IP traffic", Internet article, Jul. 2015, XP002786072, 4 pages.
Luo Ji-Zhou et al. An Efficient Compression Method of Relational Database, Journal of Software, vol. 16, No. 2. 2005. 10 pages. With English abstract.

* cited by examiner

DATA TRANSMISSION METHOD AND APPARATUS

CROSS-REFERENCE TO RELATED APPLICATIONS

This application is a continuation of International Application No. PCT/CN2016/103615, filed on Oct. 27, 2016, which claims priority to Chinese Patent Application No. 201510785464.2, filed on Nov. 16, 2015. The disclosures of the aforementioned applications are hereby incorporated by reference in their entireties.

TECHNICAL FIELD

Embodiments of the present invention relate to the database field, and in particular, to a data transmission method and apparatus.

BACKGROUND

Nodes distributed in a distributed database structure usually include a coordinator node (CN) and a data node (DN). Data usually needs to be transmitted between a CN and a DN, or between multiple DNs.

For example, a user sends a query request to a CN using an upper-layer application, and the CN sends the query request to a corresponding DN node. The DN node performs the query request and returns a query result to the CN. The CN transmits the query result to the upper-layer application for further presentation to the user.

In this process, during the data transmission between the nodes DN and CN or between the nodes DN and DN, the data transmitted between the nodes is uncompressed data, and therefore overheads for the data transmission between the nodes are relatively high, and relatively heavy load is carried on a network.

In conclusion, a data transmission method and apparatus are in need to reduce overheads for data transmission between nodes in a distributed database and lighten network load.

SUMMARY

Embodiments of the present invention provide a data transmission method and apparatus, so as to reduce overheads for data transmission between nodes in a distributed database and lighten network load.

An embodiment of the present invention provides a data transmission method, including:

determining, by a data node DN, one column that has a distribution rule, e.g., the distribution rule of parameters in the column;

determining, by the DN according to a data type of the parameters of the column and the distribution rule of the parameters in the column, a compression algorithm corresponding to the column, where there are multiple types of compression algorithms in this embodiment of the present invention, for example, a run-length encoding (RLE) algorithm, a dictionary algorithm, an LZ4 algorithm, and a Zlib algorithm, and there may be multiple data types of the parameters of the column, for example, an integer type (Integer), a long type (Long), a single-precision floating-point type (Single), a double-precision floating-point type (Double), and a currency type;

compressing, by the DN, the column using the compression algorithm; and sending, a compressed column to a target node, where optionally, the target node is a DN or a CN, and in this way, during data transmission between DNs or between a DN and a CN, compressed data may be transmitted, so as to reduce overheads for data transmission between nodes and lighten network load.

In this embodiment of the present invention, because a DN determines, according to a data type of parameters of a column and a distribution rule of the parameters in the column, a compression algorithm corresponding to the column, the column can be compressed using, as much as possible, a compression algorithm that can reach a relatively large compression ratio, and a compression algorithm can be determined more flexibly. Further, because the DN compresses the column using the determined compression algorithm and then sends a compressed column to a target node, overheads for data transmission between nodes are reduced and network load is lightened by transmitting compressed data.

Optionally, the DN determines, according to a keyword in a query command, the column that has the distribution rule, and the distribution rule of the parameters in the column.

Optionally, the DN sends indication information to the target node, where the indication information is used to indicate the compression algorithm corresponding to the column, and the indication information is used by the target node to decompress the compressed data to obtain the data. Because the DN sends the indication information to the target node, the target node decompresses the received data more successfully.

Optionally, the data is in a form of a data table. In this way, the data may be transmitted by column, and each column that has a distribution rule in the data transmitted by column may be compressed using the method provided in this embodiment of the present invention, so that data is compressed more flexibly.

Optionally, when determining that a length of a value of each parameter included in the column that has the distribution rule is not less than a threshold, the DN determines, according to the data type of the parameters of the column and the distribution rule of the parameters in the column, the compression algorithm corresponding to the column. In this case, because the values of the parameters in this column are already extremely short and do not need to be compressed, the column that has the distribution rule may not be compressed. A processing procedure is shortened, and a data transmission process is simplified.

Optionally, the column that has the distribution rule includes N parameters, values of at least two parameters in the N parameters are equal, and N is an integer greater than 1. That is, the distribution rule of the column is that values of at least two parameters in the N parameters included in this column are equal. In this way, the parameters whose values are equal may be compressed, so as to reduce an amount of data transmitted between nodes, and lighten network load.

Optionally, the determining, by a DN, one column that has a distribution rule, and the distribution rule of parameters in the column includes:

finding, by the DN according to a received query command, data that matches a keyword in the query command, where the query command includes one keyword; and determining, by the DN, a column corresponding to the keyword from the data, and using the column corresponding to the keyword as the column that has the distribution rule; where the determining, by the DN according to a data type of the parameters of the column and the distribution rule of the parameters in the column, a compression algorithm corresponding to the column includes:

when determining that the data type of the parameters of the column is a data type that supports an RLE compression algorithm and determining that the distribution rule of the column is that each of values of the parameters of the column is the keyword, determining, that the compression algorithm corresponding to the column is the RLE compression algorithm.

Optionally, the determining, by a DN, one column that has a distribution rule, and the distribution rule of parameters in the column includes:

finding, by the DN according to a received query command, data that matches a keyword in the query command, where the query command includes multiple keywords, and the multiple keywords correspond to a same column of the data; and determining, by the DN, the column corresponding to the keywords from the data, and using the column corresponding to the multiple keywords as the column that has the distribution rule; where the determining, by the DN according to a data type of the parameters of the column and the distribution rule of the parameters in the column, a compression algorithm corresponding to the column includes:

when determining that the data type of the parameters of the column is a data type that supports a dictionary compression algorithm and determining that the distribution rule of the column is that values of the parameters of the column are the multiple keywords, determining, that the compression algorithm corresponding to the column is the dictionary compression algorithm.

Optionally, the determining, by a DN, one column that has a distribution rule, and the distribution rule of parameters in the column includes:

finding, by the DN according to a received query command, data that matches a keyword in the query command, where the query command includes at least one keyword, and the at least one keyword corresponds to a same column of the data;

determining, by the DN, the column corresponding to the keyword from the data, and using the column corresponding to the keyword as the column that has the distribution rule, where the column is a column in the N-row data; and sorting, by the DN according to values of the parameters of the column and on a row-by-row basis, the N-row data corresponding to the column, where the parameters in the column are in a one-to-one correspondence with the rows of the data; where the determining, by the DN according to a data type of the parameters of the column and the distribution rule of the parameters in the column, a compression algorithm corresponding to the column includes:

when determining that the data type of the parameters of the column is a data type that supports an RLE compression algorithm and determining that the distribution rule of the column is sorted according to the values of the parameters of the column, determining, that the compression algorithm corresponding to the column is the RLE compression algorithm.

Optionally, the determining, by a DN, one column that has a distribution rule, and the distribution rule of parameters in the column includes:

finding, by the DN according to a received query command, data that matches a keyword in the query command, where the query command includes at least one keyword, and the at least one keyword corresponds to a same column of the data;

determining, by the DN, the column corresponding to the keyword from the data, and using the column corresponding to the keyword as the column that has the distribution rule, where the column is a column in the N-row data;

determining, by the DN according to values of the parameters of the column, parameters whose values are equal from the parameters of the column; and arranging together, by the DN, multiple-row data corresponding to the determined multiple parameters whose values are equal, where the parameters in the column are in a one-to-one correspondence with the rows of the data; where the determining, by the DN according to a data type of the parameters of the column and the distribution rule of the parameters in the column, a compression algorithm corresponding to the column includes:

when determining that the data type of the parameters of the column is a data type that supports an RLE compression algorithm and determining that the distribution rule of the column is arranged together the multiple-row data corresponding to the determined multiple parameters whose values are equal, determining, that the compression algorithm corresponding to the column is the RLE compression algorithm.

Based on a same conception, an embodiment of the present invention provides a data transmission method, and the method includes the following steps:

receiving, by a target node, a compressed column sent by a data node DN, where the compressed column is obtained by compression by the DN using a compression algorithm corresponding to column;

determining, by the target node, the compression algorithm corresponding to the column; and decompressing, by the target node, the compressed column using a decompression algorithm corresponding to the compression algorithm, so as to obtain the column.

In this embodiment of the present invention, because a DN determines, according to a data type of parameters of a column and a distribution rule of the parameters in the column, a compression algorithm corresponding to the column, the column can be compressed using, as much as possible, a compression algorithm that can reach a relatively large compression ratio, and a compression algorithm can be determined more flexibly. Further, because the DN compresses the column using the determined compression algorithm and then sends a compressed column to a target node, overheads for data transmission between nodes are reduced and network load is lightened by transmitting compressed data.

Optionally, the determining, by the target node, the compression algorithm corresponding to the column includes:

obtaining, by the target node through an external interface, the compression algorithm that is entered by a user and that is corresponding to the column; or receiving, by the target node, indication information that is sent by the DN and that is used to indicate the compression algorithm corresponding to the column, and determining the compression algorithm according to the indication information.

Based on a same conception, an embodiment of the present invention provides a data transmission apparatus including:

a determining unit, configured to: determine one column that has a distribution rule, and the distribution rule of parameters in the column; and determine, according to a data type of the parameters of the column and the distribution rule of the parameters in the column, a compression algorithm corresponding to the column;

a compression unit, configured to compress the column using the compression algorithm; and a transmission unit, configured to send a compressed column to a target node.

In this embodiment of the present invention, because a DN determines, according to a data type of parameters of a column and a distribution rule of the parameters in the column, a compression algorithm corresponding to the column, the column can be compressed using, as much as possible, a compression algorithm that can reach a relatively large compression ratio, and a compression algorithm can be determined more flexibly. Further, because the DN compresses the column using the determined compression algorithm and then sends a compressed column to a target node, overheads for data transmission between nodes are reduced and network load is lightened by transmitting compressed data.

Optionally, the transmission unit is further configured to:
send indication information to the target node; where
the indication information is used to indicate the compression algorithm corresponding to the column, and the indication information is used by the target node to decompress the data to obtain the data.

Optionally, the column that has the distribution rule includes N parameters, values of at least two parameters in the N parameters are equal, and N is an integer greater than 1.

Optionally, the determining unit is configured to:
find, according to a received query command, data that matches a keyword in the query command, where the query command includes one keyword;

determine a column corresponding to the keyword from the data, and use the column corresponding to the keyword as the column that has the distribution rule; and when determining that the data type of the parameters of the column is a data type that supports an RLE compression algorithm and determining that the distribution rule of the column is that each of values of the parameters of the column is the keyword, determine, by the DN, that the compression algorithm corresponding to the column is the RLE compression algorithm.

Optionally, the determining unit is configured to:
find, by the DN according to a received query command, data that matches a keyword in the query command, where the query command includes multiple keywords, and the multiple keywords correspond to a same column of the data;

determine, by the DN, the column corresponding to the keywords from the data, and use the column corresponding to the multiple keywords as the column that has the distribution rule; and when determining that the data type of the parameters of the column is a data type that supports a dictionary compression algorithm and determining that the distribution rule of the column is that values of the parameters of the column are the multiple keywords, determine, that the compression algorithm corresponding to the column is the dictionary compression algorithm.

Optionally, the determining unit is configured to:
find, by the DN according to a received query command, data that matches a keyword in the query command, where the query command includes at least one keyword, and the at least one keyword corresponds to a same column of the data;

determine, by the DN, the column corresponding to the keyword from the data, and use the column corresponding to the keyword as the column that has the distribution rule, where the column is a column in the N-row data;

sort, by the DN according to values of the parameters of the column and on a row-by-row basis, the N-row data corresponding to the column, where the parameters in the column are in a one-to-one correspondence with the rows of the data; and when determining that the data type of the parameters of the column is a data type that supports an RLE compression algorithm and determining that the distribution rule of the column is sorted according to the values of the parameters of the column, determine, by the DN, that the compression algorithm corresponding to the column is the RLE compression algorithm.

Optionally, the determining unit is configured to:
find, by the DN according to a received query command, data that matches a keyword in the query command, where the query command includes at least one keyword, and the at least one keyword corresponds to a same column of the data;

determine, by the DN, the column corresponding to the keyword from the data, and use the column corresponding to the keyword as the column that has the distribution rule, where the column is a column in the N-row data;

determine, by the DN according to values of the parameters of the column, parameters whose values are equal from the parameters of the column;

arrange together, by the DN, multiple-row data corresponding to the determined multiple parameters whose values are equal, where the parameters in the column are in a one-to-one correspondence with the rows of the data; and when determining that the data type of the parameters of the column is a data type that supports an RLE compression algorithm and determining that the distribution rule of the column is arranged together the multiple-row data corresponding to the determined multiple parameters whose values are equal, determine, that the compression algorithm corresponding to the column is the RLE compression algorithm.

For related descriptions in this embodiment, refer to the descriptions in the foregoing method procedure. Details are not described herein again.

Based on a same conception, an embodiment of the present invention provides a data transmission apparatus including:

a transmission unit, configured to receive a compressed column sent by a data node DN, where the compressed column is obtained by compression by the DN using a compression algorithm corresponding to column;

a determining unit, configured to determine the compression algorithm corresponding to the column; and a decompression unit, configured to decompress the compressed column using a decompression algorithm corresponding to the compression algorithm, so as to obtain the column.

Because a DN determines, according to a data type of parameters of a column and a distribution rule of the parameters in the column, a compression algorithm corresponding to the column, the column can be compressed using, as much as possible, a compression algorithm that can reach a relatively large compression ratio, and a compression algorithm can be determined more flexibly. Further, because the DN compresses the column using the determined compression algorithm and then sends a compressed column to a target node, overheads for data transmission between nodes are reduced and network load is lightened by transmitting compressed data.

Optionally, the determining unit is configured to:

obtain, through an external interface, the compression algorithm that is entered by a user and that is corresponding to the column; or receive indication information that is sent by the DN and that is used to indicate the compression algorithm corresponding to the column, and determine the compression algorithm according to the indication information.

For related descriptions in this embodiment, refer to the descriptions in the foregoing method procedure. Details are not described herein again.

Based on a same conception, an embodiment of the present invention provides a data transmission apparatus including:

a processor, configured to: determine one column that has a distribution rule, and the distribution rule of parameters in the column; determine, according to a data type of the parameters of the column and the distribution rule of the parameters in the column, a compression algorithm corresponding to the column; and compress the column using the compression algorithm; and a transceiver, configured to send, under control of the processor, a compressed column to a target node.

Because a DN determines, according to a data type of parameters of a column and a distribution rule of the parameters in the column, a compression algorithm corresponding to the column, the column can be compressed using, as much as possible, a compression algorithm that can reach a relatively large compression ratio, and a compression algorithm can be determined more flexibly. Further, because the DN compresses the column using the determined compression algorithm and then sends a compressed column to a target node, overheads for data transmission between nodes are reduced and network load is lightened by transmitting compressed data.

Optionally, the transceiver is further configured to:

send indication information to the target node; where the indication information is used to indicate the compression algorithm corresponding to the column, and the indication information is used by the target node to decompress the data to obtain the data.

Optionally, the column that has the distribution rule includes N parameters, values of at least two parameters in the N parameters are equal, and N is an integer greater than 1.

Optionally, the processor is configured to:

find, according to a received query command, data that matches a keyword in the query command, where the query command includes one keyword;

determine a column corresponding to the keyword from the data, and use the column corresponding to the keyword as the column that has the distribution rule; and when determining that the data type of the parameters of the column is a data type that supports an RLE compression algorithm and determining that the distribution rule of the column is that each of values of the parameters of the column is the keyword, determine, that the compression algorithm corresponding to the column is the RLE compression algorithm.

Optionally, the processor is configured to:

find, by the DN according to a received query command, data that matches a keyword in the query command, where the query command includes multiple keywords, and the multiple keywords correspond to a same column of the data;

determine, by the DN, the column corresponding to the keywords from the data, and use the column corresponding to the multiple keywords as the column that has the distribution rule; and when determining that the data type of the parameters of the column is a data type that supports a dictionary compression algorithm and determining that the distribution rule of the column is that values of the parameters of the column are the multiple keywords, determine, by the DN, that the compression algorithm corresponding to the column is the dictionary compression algorithm.

Optionally, the processor is configured to:

find, by the DN according to a received query command, data that matches a keyword in the query command, where the query command includes at least one keyword, and the at least one keyword corresponds to a same column of the data;

determine, by the DN, the column corresponding to the keyword from the data, and use the column corresponding to the keyword as the column that has the distribution rule, where the column is a column in the N-row data;

sort, by the DN according to values of the parameters of the column and on a row-by-row basis, the N-row data corresponding to the column, where the parameters in the column are in a one-to-one correspondence with the rows of the data; and when determining that the data type of the parameters of the column is a data type that supports an RLE compression algorithm and determining that the distribution rule of the column is sorted according to the values of the parameters of the column, determine, that the compression algorithm corresponding to the column is the RLE compression algorithm.

Optionally, the processor is configured to:

find, by the DN according to a received query command, data that matches a keyword in the query command, where the query command includes at least one keyword, and the at least one keyword corresponds to a same column of the data;

determine, by the DN, the column corresponding to the keyword from the data, and use the column corresponding to the keyword as the column that has the distribution rule, where the column is a column in the N-row data;

determine, by the DN according to values of the parameters of the column, parameters whose values are equal from the parameters of the column;

arrange together, by the DN, multiple-row data corresponding to the determined multiple parameters whose values are equal, where the parameters in the column are in a one-to-one correspondence with the rows of the data; and when determining that the data type of the parameters of the column is a data type that supports an RLE compression algorithm and determining that the distribution rule of the column is arranged together the multiple-row data corresponding to the determined multiple parameters whose values are equal, determine, that the compression algorithm corresponding to the column is the RLE compression algorithm.

For related descriptions in this embodiment, refer to the descriptions in the foregoing method procedure. Details are not described herein again.

Based on a same conception, an embodiment of the present invention provides a data transmission apparatus including:

a transceiver, configured to receive a compressed column sent by a data node DN, where the compressed column is obtained by compression by the DN using a compression algorithm corresponding to column; and a processor, configured to: determine the compression algorithm corresponding to the column; and decompress the compressed column using a decompression algorithm corresponding to the compression algorithm, so as to obtain the column.

Because a DN determines, according to a data type of parameters of a column and a distribution rule of the parameters in the column, a compression algorithm corresponding to the column, the column can be compressed using, as much as possible, a compression algorithm that can reach a relatively large compression ratio, and a compression algorithm can be determined more flexibly. Further, because the DN compresses the column using the determined compression algorithm and then sends a compressed column to a target node, overheads for data transmission between nodes are reduced and network load is lightened by transmitting compressed data.

Optionally, the processor is configured to:

obtain, through an external interface, the compression algorithm that is entered by a user and that is corresponding to the column; or receive indication information that is sent by the DN and that is used to indicate the compression algorithm corresponding to the column, and determine the compression algorithm according to the indication information.

For related descriptions in this embodiment, refer to the descriptions in the foregoing method procedure. Details are not described herein again.

In the embodiments of the present invention, a DN determines one column that has a distribution rule, and the distribution rule of parameters in the column; the DN determines, according to a data type of the parameters of the column and the distribution rule of the parameters in the column, a compression algorithm corresponding to the column; the DN compresses the column using the compression algorithm; and the DN sends a compressed column to a target node. Because the DN determines, according to the data type of the parameters of the column and the distribution rule of the parameters in the column, the compression algorithm corresponding to the column, the column can be compressed using, as much as possible, a compression algorithm that can reach a relatively large compression ratio, and a compression algorithm can be determined more flexibly. Further, because the DN compresses the column using the determined compression algorithm and then sends the compressed column to the target node, overheads for data transmission between nodes are reduced and network load is lightened by transmitting compressed data.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

To make the objectives, technical solutions, and advantages of the present invention clearer and more comprehensible, the following further describes the present invention in detail with reference to the accompanying drawings and embodiments. It should be understood that the specific embodiments described herein are merely used to explain the present invention but are not intended to limit the present invention.

A data transmission method provided in the embodiments of the present invention is applicable to a distributed database system. Optionally, the embodiments of the present invention may be applicable to multiple architectures of the distributed database system, for example, a share-nothing architecture, a share-all architecture, and a share-disk architecture, and particularly applicable to the share-nothing architecture.

Figure 1:
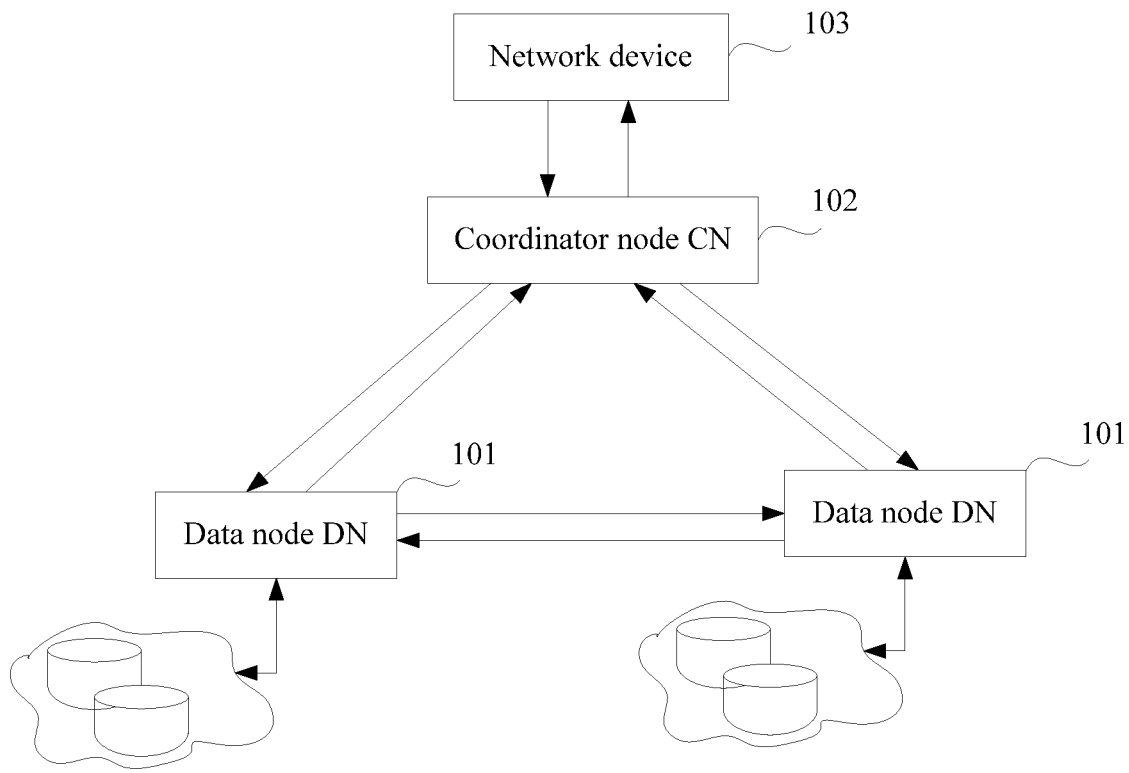
FIG. 1 is a block diagram of a system architecture applied to a data transmission method according to an embodiment of the present invention.

As shown in FIG. 1, FIG. 1 is a block diagram of a system architecture of a distributed database to which an embodiment of the present invention is applicable. The system architecture includes one or more CNs 102, each CN is connected to one or more DNs 101, and each DN 101 is a storage node of the distributed database. The CN is connected to a network device 103. Some applications may be installed on the network device 103. A user may send a query command using the network device 103, or may send a regular data management instruction, so as to use the CN to obtain data stored in the DNs or use the CN to manage data stored in the DNs.

Optionally, for better backward compatibility, global compression transmission is enabled in this embodiment of the present invention. When the method provided in this embodiment of the present invention is used, global compression transmission is enabled, or when the prior art, instead of the method provided in this embodiment of the present invention, is used to transmit data, global compression transmission is disabled.

In this embodiment of the present invention, the CN receives a query command, and the query command includes one or more keywords. When the query command includes multiple keywords, querying multiple keywords in a same column in data is used as an example in this embodiment of the present invention. The column corresponding to the multiple keywords is used as a column that has a distribution rule, a compression algorithm corresponding to the column is determined, and the column is compressed using the compression algorithm and transmitted. On the other hand, when multiple keywords included in a query command correspond to different columns of data, each column in the different columns corresponding to the multiple keywords may be determined as a column that has a distribution rule. A distribution rule of parameters in each column is determined, a compression algorithm corresponding to each column is further determined, and each column is compressed using the compression algorithm corresponding to each column and transmitted. A processing method for each column in this embodiment of the present invention is similar to that in the following content, and details are not described herein again.

The data applicable to this embodiment of the present invention may exist in a form of a data table. The following uses an example to describe the form of the data in this embodiment of the present invention. A data table stored in a DN includes 10 rows of data, and each row of data includes 6 columns. It is assumed that a column in the 6 columns is about age. In the 10 rows of data, there are 8 rows of data in which values of parameters in the sixth column are 12, and values of parameters in the sixth column in the other two rows of data are 11. If a keyword included in a query command is to query all data that indicates an age of 12, all data whose value of a parameter in the sixth column is 12 is found in the data table, that is, the foregoing 8 rows of data in which the values of the parameters in the sixth column are 12 are found from the 10 rows of data. When sorting or arranging the data according to the column is used in this embodiment of the present invention, this means that rows of data corresponding to parameters of the column are sorted or arranged according to values of the parameters of the column.

Figure 2:
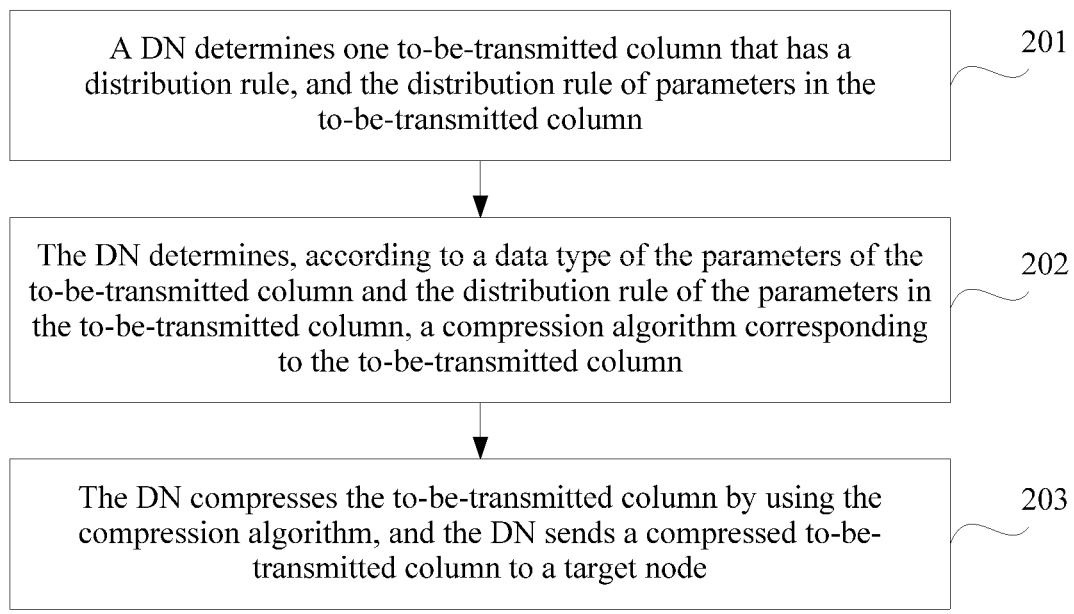
FIG. 2 is a flowchart of a data transmission method according to an embodiment of the present invention.

Based on the system architecture shown in FIG. 1, FIG. 2 shows a data transmission method provided in this embodiment of the present invention, and the method includes the following operations.

Operation 201: A DN determines one column that has a distribution rule, and the distribution rule of parameters in the column.

Operation 202: The DN determines, according to a data type of the parameters of the column and the distribution rule of the parameters in the column, a compression algorithm corresponding to the column. There are multiple types of compression algorithms in this embodiment of the present invention, for example, a run-length encoding (RLE for short) algorithm, a dictionary algorithm, an LZ4 algorithm, and a Zlib algorithm.

Operation 203: The DN compresses the column using the compression algorithm, and the DN sends a compressed column to a target node. Optionally, the target node is a DN or a CN. In this way, during data transmission between DNs or between a DN and a CN, compressed data may be transmitted, so as to reduce overheads for data transmission between nodes and lighten network load.

After the DN sends the compressed column to the target node, the target node receives the compressed column sent by the DN, determines a decompression algorithm corresponding to the column, and decompresses the compressed column using the decompression algorithm, so as to obtain the data. The compressed column is obtained by compression by the DN using the compression algorithm corresponding to the column.

Before operation 201, the CN receives a query command sent by a user, and the query command is a database SQL statement. The query command includes a keyword. The CN analyzes the query command of the SQL statement, determines a DN in which the data is stored, and sends the query command to the DN. In this case, if the CN determines that the data is stored in one DN, the CN sends the query command to the DN, or if the CN determines that the data is stored in multiple DNs, the CN sends the query command to the multiple DNs. For each DN in the multiple DNs that receives the query command, the DN finds the data according to the keyword included in the query command.

In operation 201, optionally, the DN determines, according to the keyword in the query command, the column that has the distribution rule, and the distribution rule of the parameters in the column.

In operation 202, there may be multiple data types of the parameters of the column, for example, an integer type (Integer), a long type (Long), a single-precision floating-point type (Single), a double-precision floating-point type (Double), and a currency type (Currency). Different data types support different compression algorithms. For example, when the data type of the parameters of the column is the integer type, the parameters of the column may support the RLE compression algorithm and the dictionary compression algorithm. In this case, the compression algorithm corresponding to the column may be further determined according to the distribution rule of the parameters in the column.

In an optional implementation manner, the DN determines that the data type of the parameters of the column may support multiple types of compression algorithms. In this case, a weight is determined, according to the distribution rule of the parameters in the column, for each type of compression algorithm in the compression algorithms that may be supported by the data type of the parameters of the column, and a compression algorithm that has a largest weight value is determined as the compression algorithm corresponding to the column.

In operation 202, the DN determines, according to the data type of the parameters of the column and the distribution rule of the parameters in the column, the compression algorithm corresponding to the column. In another optional implementation manner, when determining that a length of a value of each parameter included in the column that has the distribution rule is not less than a threshold, the DN determines, according to the data type of the parameters of the column and the distribution rule of the parameters in the column, the compression algorithm corresponding to the column. When determining that a length of a value of each parameter included in the column that has the distribution rule is less than a threshold, the DN determines not to compress the column that has the distribution rule.

The threshold in this embodiment of the present invention is used to correspondingly limit a length of a value of one parameter in the column. For example, the data type of the parameters of the column that has the distribution rule is the integer type, and the length of the value of each parameter in all the parameters included in the column that has the distribution rule is 1. In this case, because the values of the parameters in this column are already extremely short and do not need to be compressed, the column that has the distribution rule may not be compressed.

In operation 202, the DN determines, according to the data type of the parameters of the column and the distribution rule of the parameters in the column, the compression algorithm corresponding to the column. In another possible implementation manner, the DN obtains, through an external interface, a compression algorithm that is entered by a user and that is corresponding to the column. Specifically, the user enters a query command, may learn, according to the query command, of the column that has the distribution rule from the data. Therefore, the user directly determines, according to the data type of the parameters of the column and the distribution rule of the parameters in the column, the compression algorithm corresponding to the column. Optionally, the external interface used by the user to enter the compression algorithm may be connected to the CN, and after the CN obtains the compression algorithm that is entered by the user and that is corresponding to the column, the CN sends the compression algorithm corresponding to the column to each DN. Alternatively, the external interface is connected to the DN, and the DN directly obtains, through the external interface, the compression algorithm that is entered by the user and that is corresponding to the column. Optionally, multiple compression algorithms are preset in the DN or the CN, the user selects one from the preset multiple compression algorithms, and a program statement of the compression algorithm that is entered by the user through the external interface and that is corresponding to the column is as follows:

Select c1[ColCompressMode], c2[ColCompress Mode] . . . FROM . . . .

The ColCompressMode includes an RLE compression algorithm, a Delta compression algorithm, an LZ4 compression algorithm, a Zlib compression algorithm, a dictionary compression (Dictionary compress) algorithm, and the like. Optionally, the ColCompressMode may further include "not using a compression algorithm". That is, the user determines that the column does not need to be compressed. In this case, the user may enter, through the external interface, "not using a compression algorithm" as the compression algorithm corresponding to the column, and the DN does not compress the column using any compression algorithm.

In operation 203, optionally, the DN sends indication information to the target node. The indication information is used to indicate the compression algorithm corresponding to the column, and the indication information is used by the target node to decompress the data to obtain the data. In this way, when the DN dynamically determines, according to the data type of the parameters of the column and the distribution rule of the parameters in the column, the compression algorithm corresponding to the column, the target node may decompress, according to the indication information, the received data to obtain the data. On the other hand, because the DN sends the indication information to the target node, the target node decompresses the received data more successfully.

Optionally, the indication information and the compressed data may be sent together to the target node using one instruction, or the indication information and the compressed data may be separately sent to the target node using two instructions, and a sending order of the indication information and the compressed data is not limited in this embodiment of the present invention.

Accordingly, after operation 203, the target node determines the compression algorithm corresponding to the column in multiple specific manners. For example, the target node obtains, through an external interface, the compression algorithm that is entered by a user and that is corresponding to the column, or the target node receives the indication information that is sent by the DN and that is used to indicate the compression algorithm, and determines the compression algorithm according to the indication information.

In another possible implementation manner, the target node determines, according to the query command, one column that has a distribution rule, and the distribution rule of parameters in the column; determines, according to the data type of the parameters of the column and the distribution rule of the parameters in the column, a compression algorithm corresponding to the column; and further decompresses the received compressed column. In this way, an amount of data transmitted between nodes may be reduced, and network load may be lightened.

In this embodiment of the present invention, optionally, the column that has the distribution rule includes N parameters, values of at least two parameters in the N parameters are equal, and N is an integer greater than 1. That is, the distribution rule of the column is that values of at least two parameters in the N parameters included in this column are equal. In this way, the parameters whose values are equal may be compressed, so as to reduce the amount of data transmitted between the nodes, and lighten the network load.

In another embodiment, the column that has the distribution rule includes N parameters, values of at least two parameters in the N parameters are the same, and the parameters whose values are the same have adjacent locations.

In specific implementation, if data in multiple DNs is associated with each other, and there is usually a join (join) operation for the data in the multiple DNs, for example, the query command includes sorting, gathering, or the like, an operation such as sorting or gathering has been performed on data returned by the DNs. The CN combines the data that is returned by the multiple DNs and that has been sorted or classified, performs a combined sorting operation or a combined gathering operation, and then returns data that is finally obtained after processing to a network device for checking and using by the user. Gathering specifically means classifying the data, for example, classifying together data whose value is the same. Based on the specific application scenario, the following describes several optional implementation manners for operation 201 and operation 202 in detail.

Example a1

In operation 201 and operation 202, the DN finds, according to a received query command, data that matches a keyword in the query command. The query command includes one keyword. The DN determines a column corresponding to the keyword from the data, and uses the column corresponding to the keyword as the column that has the distribution rule.

Accordingly, when determining that the data type of the parameters of the column is a data type that supports the RLE compression algorithm and determining that the distribution rule of the column is that each of values of the parameters of the column is the keyword, the DN determines that the compression algorithm corresponding to the column is the RLE compression algorithm.

A specific example is provided in the following. For example, a query command is selecting, from a personal information table for students who graduated from a first primary school in 2013, all student personal information in which a value of a parameter "class" in the second column is "A". The query command includes one keyword "A". A corresponding column that has a distribution rule is the second column. The distribution rule of the column is that each of values of the parameters of the column is the keyword, that is, the distribution rule of the column is that each of values of parameters of the second column is "A". A data type of the second column is the integer type, and the second column supports the RLE compression algorithm. Therefore, the DN determines that a compression algorithm corresponding to the column is the RLE compression algorithm.

For example, there are a total of six rows of data in all the student personal information that is selected from the personal information table for students who graduated from a first primary school in 2013 and in which data of "class" in the second column is "A". When the DN does not compress the column that has the distribution rule, six values "A, A, A, A, A, A" need to be transmitted in sequence. However, if the column that has the distribution rule is compressed using the RLE compression algorithm, only a compressed second column of data needs to be transmitted, and the compressed second column of data is "A6", that is, six As.

The user may write a query command statement according to a specific query command. For example, to select all data whose value is "2015030" from a column "optype" and a column "date" of a data table "t2", a query command statement may be written as:

select optype, date from t2 where date="2015030".

Example a2

In operation 201 and operation 202, the DN finds, according to a received query command, data that matches a keyword in the query command. The query command includes multiple keywords, and the multiple keywords correspond to a same column of the data. The DN determines the column corresponding to the keywords from the data, and uses the column corresponding to the multiple keywords as the column that has the distribution rule.

Accordingly, when determining that the data type of the parameters of the column is a data type that supports the dictionary compression algorithm and determining that the distribution rule of the column is that values of the parameters of the column are the multiple keywords, the DN determines that the compression algorithm corresponding to the column is the dictionary compression algorithm.

For example, a query command is selecting, from a personal information table for students who graduated from a first primary school in 2013, all student information in which a data value of "age" in the third column is "11" or "12". An example of found data is shown in Table 1. In this example, the query command includes multiple keywords: "11" and "12". The multiple keywords correspond to a same column of the data, that is, both "11" and "12" are values of parameters "age" in the third column. A column that has a distribution rule is the third column, and the distribution rule of the column is that values of the parameters of the column are the multiple keywords, that is, all the values of the parameters in the third column are "11" or "12".

TABLE 1

| Name | Class | Age | Telephone number |
|---|---|---|---|
| Student a | A | 12 | 12311111111 |
| Student b | A | 11 | 12322222222 |
| Student c | A | 12 | 12333333333 |
| Student e | A | 11 | 12355555555 |
| Student f | A | 12 | 12322222222 |
| Student g | B | 12 | 12335642568 |

Table 1 shows the student information that is selected from the personal information table for students who graduated from a first primary school in 2013 and in which a data value of "age" in the third column is "11" or "12".

When the DN does not compress the third column in Table 1, several pieces of data "12, 11, 12, 11, 12, 12" need to be transmitted in sequence. However, if the third column is compressed using the dictionary compression algorithm, "11" is substituted with "0", and "12" is substituted with "1", only a compressed third column of data "101011" needs to be transmitted. It may be learned that a length of original data that needs to be transmitted is greatly shortened using the dictionary compression algorithm. In this way, network load may be lightened.

The user may write a query command statement according to a specific query command. For example, to query data whose value is "20150730", "20150729", or "20150715" from a column "optype" and a column "date" of a data table "t1", it may be learned that raw data is relatively long. In this case, using the dictionary compression algorithm, "20150730" is substituted with "0", "20150729" is substituted with "1", and "20150715" is substituted with "2". Therefore, a query command statement may be written as:

select optype, date from t1 where date='20150730' or date='20150729' or date='20150715';

Dictionary compression:

'20150730'0

'20150729'1

'20150715'2

For example, to query data whose value is "insert", "update", or "delete" from a column "optype" of a data table "t1", it may be learned that raw data is relatively long. In this case, using the dictionary compression algorithm, "insert" is substituted with "0", "update" is substituted with "1", and "delete" is substituted with "2". Therefore, a query command statement may be written as:

select * from t1 where optype in ('insert', 'update', 'delete');

Dictionary compression:

'insert'→0

'update'→1

'delete'→2

In this embodiment of the present invention, when multiple keywords correspond to multiple columns, the method steps in steps 201 to 203 may be performed for each column that has a distribution rule. For example, to query personal information of students whose ages in the third column are "11" or "12" and whose classes in the second column are "A" or "B", a compression algorithm corresponding to the second column may be determined for the second column, and a compression algorithm corresponding to the third column may be determined for the third column. In this embodiment of the present invention, one column that has a distribution rule is used as an example for description.

Example a3

In operation 201 and operation 202, the DN finds, according to a received query command, data that matches a keyword in the query command. The query command includes at least one keyword, and the at least one keyword corresponds to a same column of the data. The DN determines the column corresponding to the keyword from the data, and uses the column corresponding to the keyword as the column that has the distribution rule. The column is a column in the N-row data. The DN sorts, according to values of parameters of the column and on a row-by-row basis, the N-row data corresponding to the column. The parameters in the column are in a one-to-one correspondence with the rows of the data.

Accordingly, when determining that a data type of the parameters of the column is a data type that supports an RLE compression algorithm and determining that the distribution rule of the column is sorted according to the values of the parameters of the column, the DN determines that a compression algorithm corresponding to the column is the RLE compression algorithm.

For example, a query command is finding data indicating an age of "11", "12", or "13" in the third column in a personal information table for students who graduated from a first primary school in 2013, and sorting data according to an ascending order of values of parameters "age" in the third column of the personal information table for students who graduated from a first primary school in 2013. In this example, the query command includes at least one keyword "11", "12", or "13", and the at least one keyword corresponds to the third column of the data. That the parameters in the column are in a one-to-one correspondence with the rows of the data means that each parameter in the third column corresponds to one row of data. That the DN sorts, according to values of parameters of the column and on a row-by-row basis, the N-row data corresponding to the column means that the DN sorts the found multiple-row data on a row-by-row basis according to ages in the third column. When determining that the data type of the parameters of the column is the integer type, that is, the data type that supports the RLE compression algorithm, and determining that the distribution rule of the column is sorted according to the values of the parameters of the column, meaning that a distribution rule of the third column is sorted according to the values of the parameters of the third column, the DN determines that the compression algorithm corresponding to the third column is the RLE compression algorithm.

The found data indicating an age of "11", "12", or "13" in the third column in the personal information table for students who graduated from a first primary school in 2013 is shown in Table 2.

| Name | Class | Age | Telephone number |
| --- | --- | --- | --- |
| Student a | A | 12 | 12311111111 |
| Student b | A | 11 | 12322222222 |
| Student c | A | 12 | 12333333333 |
| Student d | A | 13 | 12344444444 |
| Student e | A | 11 | 12355555555 |
| Student f | A | 12 | 12322222222 |

Table 2 shows personal information of all students in class A that is selected from the personal information table for students who graduated from a first primary school in 2013.

The selected data is sorted according to data values of "age" in the third column of the personal information table for students who graduated from a first primary school in 2013, and a result of sorting is shown in Table 3.

| Name | Class | Age | Telephone number |
| --- | --- | --- | --- |
| Student b | A | 11 | 12322222222 |
| Student e | A | 11 | 12355555555 |
| Student a | A | 12 | 12311111111 |
| Student c | A | 12 | 12333333333 |
| Student f | A | 12 | 12322222222 |
| Student d | A | 13 | 12344444444 |

Table 3 shows data obtained by sorting according to an ascending order of the data values of "age" in the third column in Table 2.

In Table 3, sorting is performed according to the data values in the third column of the selected data. That is, an order by (order by) query plan type is used to query all data that meets a first condition. The "order by" means sorting all the data that meets the first condition.

When the DN does not compress the third column in Table 3, several pieces of data "11, 11, 12, 12, 12, 13" need to be transmitted in sequence. However, if the third column is compressed using the RLE compression algorithm, only a compressed third column of data "112123131" needs to be transmitted, and "112123131" means two 11s, three 12s, and one 13.

Example a4

In operation 201 and operation 202, the DN finds, according to a received query command, data that matches a keyword in the query command. The query command includes at least one keyword, and the at least one keyword corresponds to a same column of the data. The DN determines the column corresponding to the keyword from the data, and uses the column corresponding to the keyword as the column that has the distribution rule. The column is a column in the N-row data. The DN determines, according to values of parameters of the column, parameters whose values are equal from the parameters of the column. The DN arranges together multiple-row data corresponding to the determined multiple parameters whose values are equal. The parameters in the column are in a one-to-one correspondence with the rows of the data.

Accordingly, when determining that a data type of the parameters of the column is a data type that supports the RLE compression algorithm and determining that the distribution rule of the column is arranged together the multiple-row data corresponding to the determined multiple parameters whose values are equal, the DN determines that a compression algorithm corresponding to the column is the RLE compression algorithm.

For example, a query command is finding data indicating an age of "11", "12", or "13" in the third column in a personal information table for students who graduated from a first primary school in 2013, and performing gathering according to data values of "age" in the third column of the personal information table for students who graduated from a first primary school in 2013, that is, arranging together data whose value is the same in the third column. In this example, the query command includes at least one keyword "11", "12", or "13", the at least one keyword corresponds to the third column of the data, a distribution rule of the third column is arranged together the multiple-row data in which the values of the parameters are equal in the third column, and the data type of the third column supports the RLE compression algorithm. The DN determines that a compression algorithm corresponding to the column is the RLE compression algorithm.

The found data indicating an age of "11", "12", or "13" in the third column in the personal information table for students who graduated from a first primary school in 2013 is shown in Table 2. Gathering is performed according to the data values of "age" in the third column of the personal information table for students who graduated from a first primary school in 2013, data whose value is the same in the third column is arranged together, and obtained data is shown in Table 4.

| Name | Class | Age | Telephone number |
| --- | --- | --- | --- |
| Student a | A | 12 | 12311111111 |
| Student c | A | 12 | 12333333333 |
| Student f | A | 12 | 12322222222 |
| Student b | A | 11 | 12322222222 |
| Student e | A | 11 | 12355555555 |
| Student d | A | 13 | 12344444444 |

Table 4 is obtained by performing gathering according to the data values of "age" in the third column in Table 2 and by arranging together the data whose value is the same in the third column.

In Table 4, gathering is performed according to the values of parameters "age" in the third column of the personal information table for students who graduated from a first primary school in 2013, the multiple-row data whose value is the same in the third column is arranged together. That is, a group by (group by) query plan type is used to query data. The "group by" means gathering all data.

When the DN does not compress the third column in Table 4, several pieces of data "12, 12, 12, 11, 11, 13" need to be transmitted in sequence. However, if the third column is compressed using the RLE compression algorithm, only a compressed third column of data "123112131" needs to be transmitted, and "123112131" means three 12s, two 11s, and one 13.

In operation 203, that the DN sends compressed data to a target node includes:

determining, by the DN, each column of data in the compressed data, and sending, by the DN, each column of data in the compressed data to the target node. In this embodiment of the present invention, because for each column, the DN may set a compression algorithm corresponding to the column, when the DN sends each column of data to the target node, the target node may receive each column of data and decompress a compressed column with reference to a compression algorithm corresponding to the column. In this way, the method provided in this embodiment of the present invention may be used to compress each column that has a distribution rule, so as to more flexibly compress data and further lighten network load of a system.

Based on the foregoing descriptions, this embodiment of the present invention provides the following example to describe specific application scenarios in which the target node is a DN and the target node is a CN.

"First", "second", "third", and "fourth" in a "first DN", a "second DN", "first data", "second data", "third data", "fourth data", a "first compression algorithm", a "second compression algorithm", a "third compression algorithm", and a "fourth compression algorithm" in the following example are merely for a purpose of distinguishing and shall not be construed as a limitation.

A user sends a query command "querying information table of students in classes corresponding to several class teachers". The user sends a Structured Query Language (SQL) statement of the query command to a CN using an upper application.

In this example, two types of tables are included: a "class information table" and a "student information table". The class information table includes a class name and a name of a class teacher of the class. The student information table includes a student name, a student age, a student number, and a name of a class in which a student studies. However, there is no name of a class teacher in the student information table. In a distributed database system, the "class information table" is divided into two different parts separately stored in a first DN and a second DN. For example, class information tables of a first class to a fifth class are stored in a "class information table" in the first DN, and class information tables of a sixth class to a tenth class are stored in a "class information table" in the second DN. The "student information table" may be divided into two different parts separately stored in the first DN and the second DN. For example, there are a total of 1,000 students in the first class to the tenth class in the whole school, student information of all students whose student numbers are even numbers is stored in the first DN, and student information of all students whose student numbers are odd numbers is stored in the second DN.

The CN analyzes the query command and determines that the first DN and the second DN store the "student information tables" and the "class information tables", and the CN sends the query command to the first DN and the second DN. Both the first DN and the second DN store incomplete "class information tables". Only the "class information table" includes class teacher information, and the "student information table" does not include the class teacher information. Therefore, when each DN needs to query each "information table of students in a class corresponding to a class teacher", the DN needs to first determine, according to the "class information table", a class name corresponding to the class teacher, and then determine, according to the class name, all student information corresponding to the class name from the "student information table". Therefore, the first DN and the second DN need to first separately broadcast their respective "class information tables" stored therein, so that each DN receives a "class information table" broadcasted by the other DN. In this way, a "class information table" that includes all class names and class teacher names of the classes is stored on each DN, that is, both "class information tables" stored in the first DN and the second DN include class information of the first class to the tenth class. The first DN and the second DN each join the received and broadcast "class information tables" and the "student information tables" stored therein, so that each DN in the first DN and the second DN can determine a corresponding class name according to class teacher information in a complete "class information table" and then determine, according to the determined class name, all students corresponding to the class name from the "student information table". Specific steps are as follows:

The first DN receives a query command sent by the CN. The first DN determines first data: a "class information table stored in the first DN". The first DN determines a first compression algorithm corresponding to the "class information table stored in the first DN". The first DN compresses the first data using the first compression algorithm and sends compressed first data to the second DN. The first DN further sends, to the second DN, indication information that is used to indicate the first compression algorithm.

The second DN receives the query command sent by the CN. The second DN determines second data: a "class information table stored in the second DN". The second DN determines a second compression algorithm corresponding to the "class information table stored in the second DN". The second DN compresses, using the second compression algorithm, the second data, and sends compressed second data to the first DN. The second DN further sends, to the first DN, indication information that is used to indicate the second compression algorithm.

The first DN receives the second data: the "class information table stored in the second DN" and the indication information indicating the second compression algorithm that are sent by the second DN. The first DN decompresses the second data using the second compression algorithm, so as to obtain the decompressed second data. Then, the first DN joins the received "class information table stored in the second DN" and the "student information table" stored in the first DN. The first DN determines, according to the current "class information table" stored in the first DN, class names corresponding to the class teacher names that need to be queried, and then determines, according to the class names, third data: "student information corresponding to the class names that is stored in the first DN". The first DN determines a third compression algorithm corresponding to the "student information corresponding to the class names that is stored in the first DN". The first DN compresses the third data using the third compression algorithm and sends compressed third data to the CN. The first DN sends, to the CN, indication information that is used to indicate the third compression algorithm.

The second DN receives the first data: the "class information table stored by the first DN" and the indication information indicating the first compression algorithm that are sent by the first DN. The second DN decompresses the first data using the first compression algorithm, so as to obtain the decompressed first data. Then, the second DN joins the received "class information table stored in the first DN" and the "student information table" stored in the second DN. The second DN determines, according to the current "class information table" stored in the second DN, class names corresponding to the class teacher names that need to be queried, and then determines, according to the class names, fourth data: "student information corresponding to the class names that is stored in the second DN". The second DN determines a fourth compression algorithm corresponding to the "student information corresponding to the class names that is stored in the second DN". The second DN compresses the fourth data using the fourth compression algorithm and sends compressed fourth data to the CN. The second DN sends, to the CN, indication information that is used to indicate the fourth compression algorithm.

The CN decompresses, for the received information, the compressed third data using the third compression algorithm and the compressed fourth data using the fourth compression algorithm, so as to obtain the "information table of students in classes corresponding to several class teachers" required in the query command. The CN returns the "information table of students in classes corresponding to several class teachers" to the upper application, so that the user obtains the data.

It may be learned from the foregoing content that, in this embodiment of the present invention, a DN determines one column that has a distribution rule, and the distribution rule of parameters in the column; the DN determines, according to a data type of the parameters of the column and the distribution rule of the parameters in the column, a compression algorithm corresponding to the column; the DN compresses the column using the compression algorithm; and the DN sends a compressed column to a target node. Because the DN determines, according to the data type of the parameters of the column and the distribution rule of the parameters in the column, the compression algorithm corresponding to the column, the column can be compressed using, as much as possible, a compression algorithm that can reach a relatively large compression ratio, and a compression algorithm can be determined more flexibly. Further, because the DN compresses the column using the determined compression algorithm and then sends the compressed column to the target node, overheads for data transmission between nodes are reduced and network load is lightened by transmitting compressed data.

Figure 3:
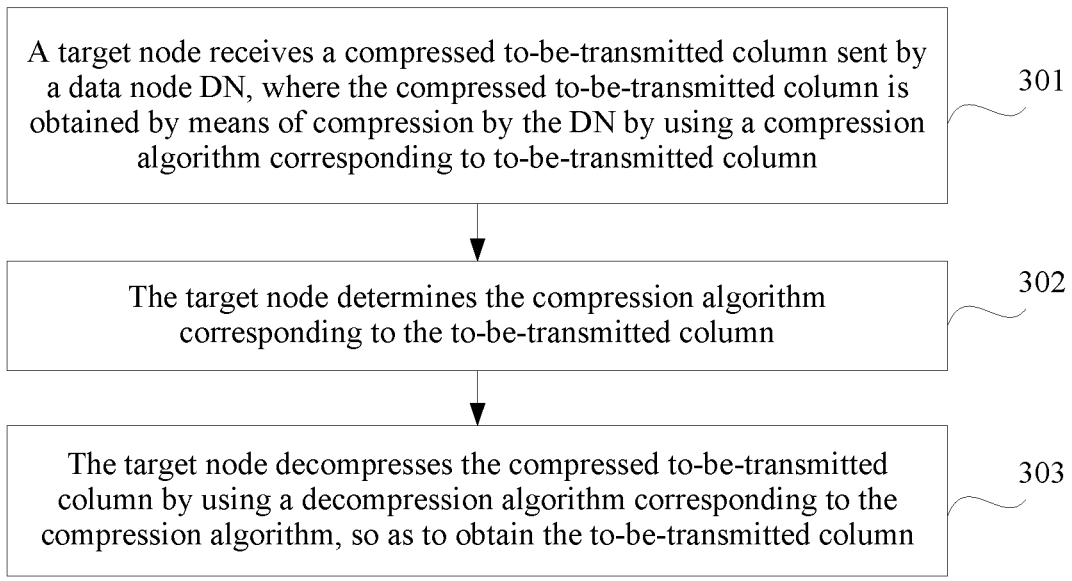
FIG. 3 is a flowchart of another data transmission method according to an embodiment of the present invention.

FIG. 3 shows an example of a flowchart of a data transmission method according to in an embodiment of the present invention.

Based on a similar conception, this embodiment of the present invention provides a data transmission method, and the method includes the following operations:

Operation 301: A target node receives a compressed column sent by a data node DN, where the compressed column is obtained by compression by the DN using a compression algorithm corresponding to column.

Operation 302: The target node determines the compression algorithm corresponding to the column.

Operation 303: The target node decompresses the compressed column using a decompression algorithm corresponding to the compression algorithm, so as to obtain the column.

Optionally, the determining, by the target node, the compression algorithm corresponding to the column includes:

obtaining, by the target node through an external interface, the compression algorithm that is entered by a user and that is corresponding to the column; or receiving, by the target node, indication information that is sent by the DN and that is used to indicate the compression algorithm corresponding to the column, and determining the compression algorithm according to the indication information.

Optionally, the target node is a DN or a coordinator node CN.

It may be learned from the foregoing content that, because a DN compresses data using a determined compression algorithm and sends compressed data to a target node, and because the compressed data is smaller than the data before the compression, overheads for data transmission between nodes are reduced and network load is lightened by transmitting the compressed data. Further, because the DN determines a compression algorithm corresponding to at least one column, that is, the DN may dynamically determine a compression algorithm corresponding to data, the data can be compressed using, as much as possible, a compression algorithm that can reach a relatively large compression ratio, a compression algorithm can be determined more flexibly, the overheads for the data transmission between the nodes are further reduced, and the network load is further lightened.

Figure 4:
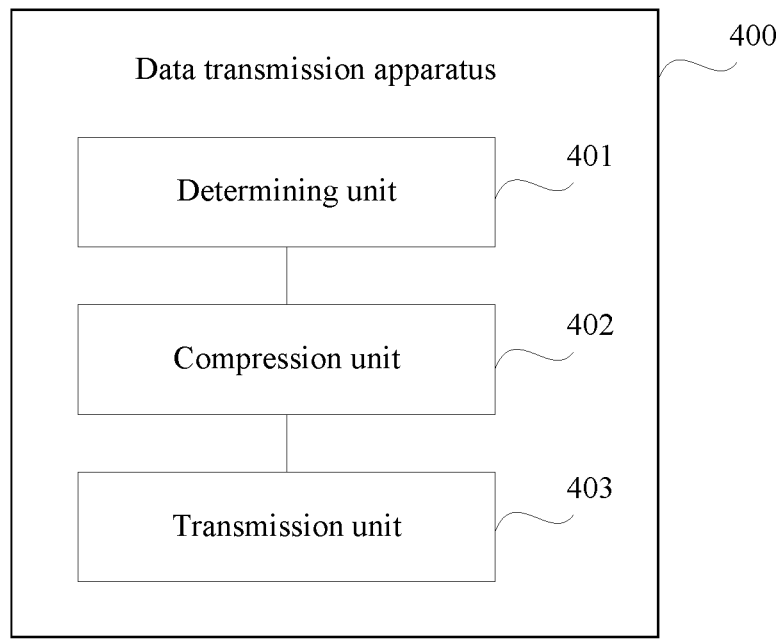
FIG. 4 is a block diagram of a data transmission apparatus according to an embodiment of the present invention.

FIG. 4 shows an example of a block diagram of a data transmission apparatus according to an embodiment of the present invention.

Based on a similar conception, this embodiment of the present invention provides a data transmission apparatus 40 configured to perform the foregoing method procedure, and the apparatus 400 includes a determining unit 401, a compression unit 402, and a transmission unit 403.

The determining unit is configured to: determine one column that has a distribution rule, e.g., the distribution rule of parameters in the column; and determine, according to a data type of the parameters of the column and the distribution rule of the parameters in the column, a compression algorithm corresponding to the column.

The compression unit is configured to compress the column using the compression algorithm.

The transmission unit is configured to send a compressed column to a target node.

Optionally, the transmission unit is further configured to: send indication information to the target node.

The indication information is used to indicate the compression algorithm corresponding to the column, and the indication information is used by the target node to decompress the data to obtain the data.

Optionally, the column that has the distribution rule includes N parameters, values of at least two parameters in the N parameters are equal, and N is an integer greater than 1.

Optionally, the determining unit is configured to:

find, according to a received query command, data that matches a keyword in the query command, where the query command includes one keyword;

determine a column corresponding to the keyword from the data, and use the column corresponding to the keyword as the column that has the distribution rule; and when determining that the data type of the parameters of the column is a data type that supports an RLE compression algorithm and determining that the distribution rule of the column is that each of values of the parameters of the column is the keyword, determine that the compression algorithm corresponding to the column is the RLE compression algorithm.

Optionally, the determining unit is configured to:

find according to a received query command, data that matches a keyword in the query command, where the query command includes multiple keywords, and the multiple keywords correspond to a same column of the data;

determine the column corresponding to the keywords from the data, and use the column corresponding to the multiple keywords as the column that has the distribution rule; and when determining that the data type of the parameters of the column is a data type that supports a dictionary compression algorithm and determining that the distribution rule of the column is that values of the parameters of the column are the multiple keywords, determine that the compression algorithm corresponding to the column is the dictionary compression algorithm.

Optionally, the determining unit is configured to:

find, according to a received query command, data that matches a keyword in the query command, where the query command includes at least one keyword, and the at least one keyword corresponds to a same column of the data;

determine the column corresponding to the keyword from the data, and use the column corresponding to the keyword as the column that has the distribution rule, where the column is a column in the N-row data;

sort, according to values of the parameters of the column and on a row-by-row basis, the N-row data corresponding to the column, where the parameters in the column are in a one-to-one correspondence with the rows of the data; and when determining that the data type of the parameters of the column is a data type that supports an RLE compression algorithm and determining that the distribution rule of the column is sorted according to the values of the parameters of the column, determine that the compression algorithm corresponding to the column is the RLE compression algorithm.

Optionally, the determining unit is configured to:

find, according to a received query command, data that matches a keyword in the query command, where the query command includes at least one keyword, and the at least one keyword corresponds to a same column of the data;

determine the column corresponding to the keyword from the data, and use the column corresponding to the keyword as the column that has the distribution rule, where the column is a column in the N-row data;

determine according to values of the parameters of the column, parameters whose values are equal from the parameters of the column;

arrange together multiple-row data corresponding to the determined multiple parameters whose values are equal, where the parameters in the column are in a one-to-one correspondence with the rows of the data; and when determining that the data type of the parameters of the column is a data type that supports an RLE compression algorithm and determining that the distribution rule of the column is arranged together the multiple-row data corresponding to the determined multiple parameters whose values are equal, determine, that the compression algorithm corresponding to the column is the RLE compression algorithm.

Optionally, the target node is a DN or a coordinator node CN.

It may be learned from the foregoing content that, in this embodiment of the present invention, a DN determines one column that has a distribution rule, and the distribution rule of parameters in the column; the DN determines, according to a data type of the parameters of the column and the distribution rule of the parameters in the column, a compression algorithm corresponding to the column; the DN compresses the column using the compression algorithm; and the DN sends a compressed column to a target node. Because the DN determines, according to the data type of the parameters of the column and the distribution rule of the parameters in the column, the compression algorithm corresponding to the column, the column can be compressed using, as much as possible, a compression algorithm that can reach a relatively large compression ratio, and a compression algorithm can be determined more flexibly. Further, because the DN compresses the column using the determined compression algorithm and then sends the compressed column to the target node, overheads for data transmission between nodes are reduced and network load is lightened by transmitting compressed data.

Figure 5:
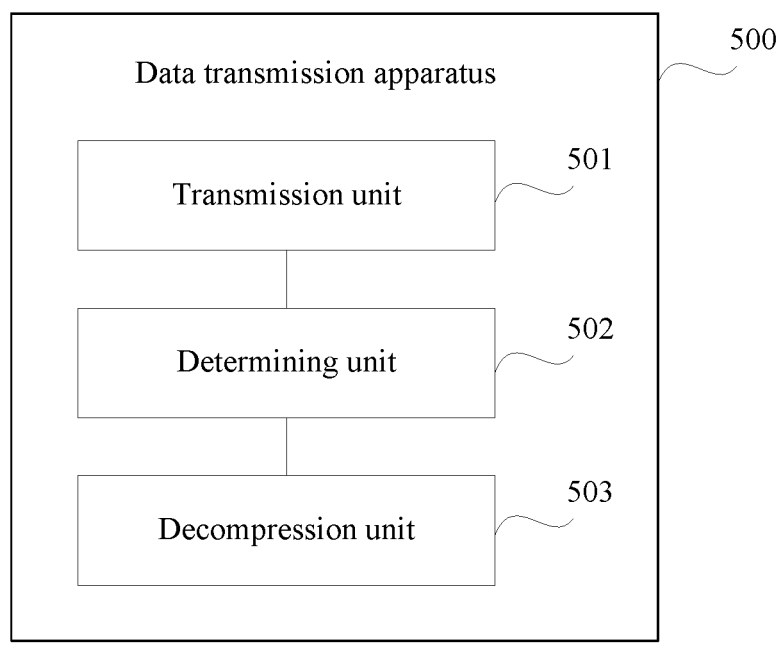
FIG. 5 is a block diagram of another data transmission apparatus according to an embodiment of the present invention.

FIG. 5 shows an example of a block diagram of a data transmission apparatus according to an embodiment of the present invention.

Based on a similar conception, this embodiment of the present invention provides a data transmission apparatus 500 configured to perform the foregoing method procedure, and the apparatus 500 includes a transmission unit 501, a determining unit 502, and a decompression unit 503.

The transmission unit is configured to receive a compressed column sent by a data node DN, where the compressed column is obtained by compression by the DN using a compression algorithm corresponding to column.

The determining unit is configured to determine the compression algorithm corresponding to the column.

The decompression unit is configured to decompress the compressed column using a decompression algorithm corresponding to the compression algorithm, so as to obtain the column.

Optionally, the determining unit is configured to:

obtain, through an external interface, the compression algorithm that is entered by a user and that is corresponding to the column; or receive indication information that is sent by the DN and that is used to indicate the compression algorithm corresponding to the column, and determine the compression algorithm according to the indication information.

Optionally, the target node is a DN or a coordinator node CN.

It may be learned from the foregoing content that, in this embodiment of the present invention, a DN determines one column that has a distribution rule, and the distribution rule of parameters in the column; the DN determines, according to a data type of the parameters of the column and the distribution rule of the parameters in the column, a compression algorithm corresponding to the column; the DN compresses the column using the compression algorithm;

and the DN sends a compressed column to a target node. Because the DN determines, according to the data type of the parameters of the column and the distribution rule of the parameters in the column, the compression algorithm corresponding to the column, the column can be compressed using, as much as possible, a compression algorithm that can reach a relatively large compression ratio, and a compression algorithm can be determined more flexibly. Further, because the DN compresses the column using the determined compression algorithm and then sends the compressed column to the target node, overheads for data transmission between nodes are reduced and network load is lightened by transmitting compressed data.

Figure 6:
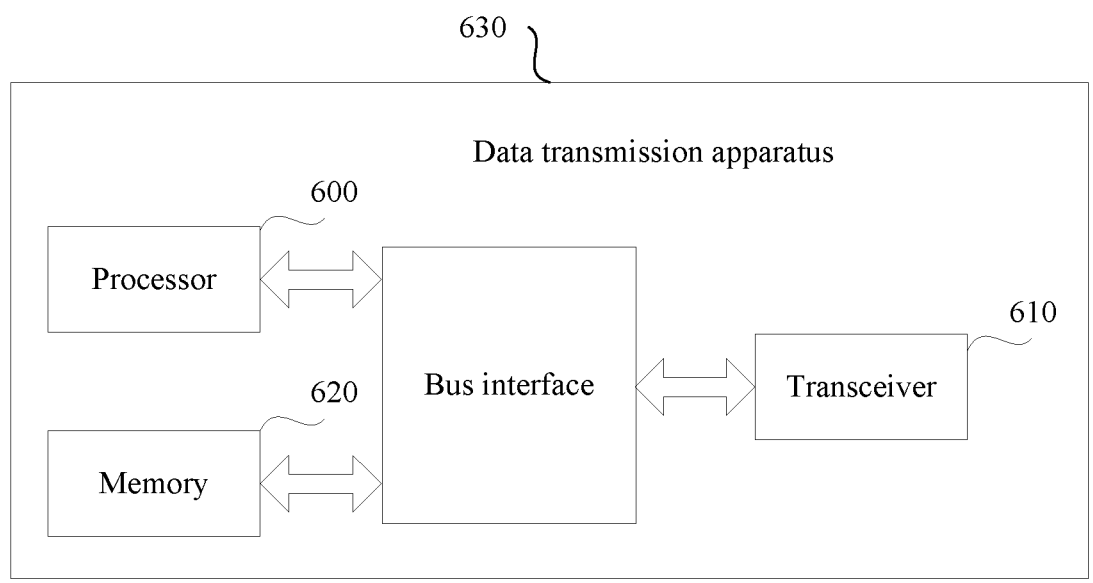
FIG. 6 is a block diagram of another data transmission apparatus according to an embodiment of the present invention.

FIG. 6 shows an example of a block diagram of a data transmission apparatus according to an embodiment of the present invention.

Based on a similar conception, this embodiment of the present invention provides a data transmission apparatus 630 configured to perform the foregoing method procedure, and the apparatus 630 includes a processor 600, a transceiver 610, and a memory 620.

The processor is configured to read a program in the memory and perform the following processes:

determining a column that has a distribution rule, e.g., the distribution rule of parameters in the column; determining, according to a data type of the parameters of the column and the distribution rule of the parameters in the column, a compression algorithm corresponding to the column; and compressing the column using the compression algorithm.

Optionally, the transceiver is further configured to:

send, under control of the processor, a compressed column to a target node.

send indication information to the target node.

The indication information is used to indicate the compression algorithm corresponding to the column, and the indication information is used by the target node to decompress the data to obtain the data.

Optionally, the column that has the distribution rule includes N parameters, values of at least two parameters in the N parameters are equal, and N is an integer greater than 1.

Optionally, the processor is configured to:

find, according to a received query command, data that matches a keyword in the query command, where the query command includes one keyword;

determine a column corresponding to the keyword from the data, and use the column corresponding to the keyword as the column that has the distribution rule; and when determining that the data type of the parameters of the column is a data type that supports an RLE compression algorithm and determining that the distribution rule of the column is that each of values of the parameters of the column is the keyword, determine, by the DN, that the compression algorithm corresponding to the column is the RLE compression algorithm.

Optionally, the processor is configured to:

find, according to a received query command, data that matches a keyword in the query command, where the query command includes multiple keywords, and the multiple keywords correspond to a same column of the data;

determine the column corresponding to the keywords from the data, and use the column corresponding to the multiple keywords as the column that has the distribution rule; and when determining that the data type of the parameters of the column is a data type that supports a dictionary compression algorithm and determining that the distribution rule of the column is that values of the parameters of the column are the multiple keywords, determine, by the DN, that the compression algorithm corresponding to the column is the dictionary compression algorithm.

Optionally, the processor is configured to:

find, according to a received query command, data that matches a keyword in the query command, where the query command includes at least one keyword, and the at least one keyword corresponds to a same column of the data;

determine the column corresponding to the keyword from the data, and use the column corresponding to the keyword as the column that has the distribution rule, where the column is a column in the N-row data;

sort, according to values of the parameters of the column and on a row-by-row basis, the N-row data corresponding to the column, where the parameters in the column are in a one-to-one correspondence with the rows of the data; and when determining that the data type of the parameters of the column is a data type that supports an RLE compression algorithm and determining that the distribution rule of the column is sorted according to the values of the parameters of the column, determine that the compression algorithm corresponding to the column is the RLE compression algorithm.

Optionally, the processor is configured to:

find, according to a received query command, data that matches a keyword in the query command, where the query command includes at least one keyword, and the at least one keyword corresponds to a same column of the data;

determine the column corresponding to the keyword from the data, and use the column corresponding to the keyword as the column that has the distribution rule, where the column is a column in the N-row data;

determine, according to values of the parameters of the column, parameters whose values are equal from the parameters of the column;

arrange together multiple-row data corresponding to the determined multiple parameters whose values are equal, where the parameters in the column are in a one-to-one correspondence with the rows of the data; and when determining that the data type of the parameters of the column is a data type that supports an RLE compression algorithm and determining that the distribution rule of the column is arranged together the multiple-row data corresponding to the determined multiple parameters whose values are equal, determine, by the DN, that the compression algorithm corresponding to the column is the RLE compression algorithm.

Optionally, the target node is a DN or a coordinator node CN.

It may be learned from the foregoing content that, in this embodiment of the present invention, a DN determines one column that has a distribution rule, and the distribution rule of parameters in the column; the DN determines, according to a data type of the parameters of the column and the distribution rule of the parameters in the column, a compression algorithm corresponding to the column; the DN compresses the column using the compression algorithm; and the DN sends a compressed column to a target node. Because the DN determines, according to the data type of the parameters of the column and the distribution rule of the parameters in the column, the compression algorithm corresponding to the column, the column can be compressed using, as much as possible, a compression algorithm that can reach a relatively large compression ratio, and a compression algorithm can be determined more flexibly. Further, because the DN compresses the column using the determined compression algorithm and then sends the compressed column to the target node, overheads for data transmission between nodes are reduced and network load is lightened by transmitting compressed data.

Figure 7:
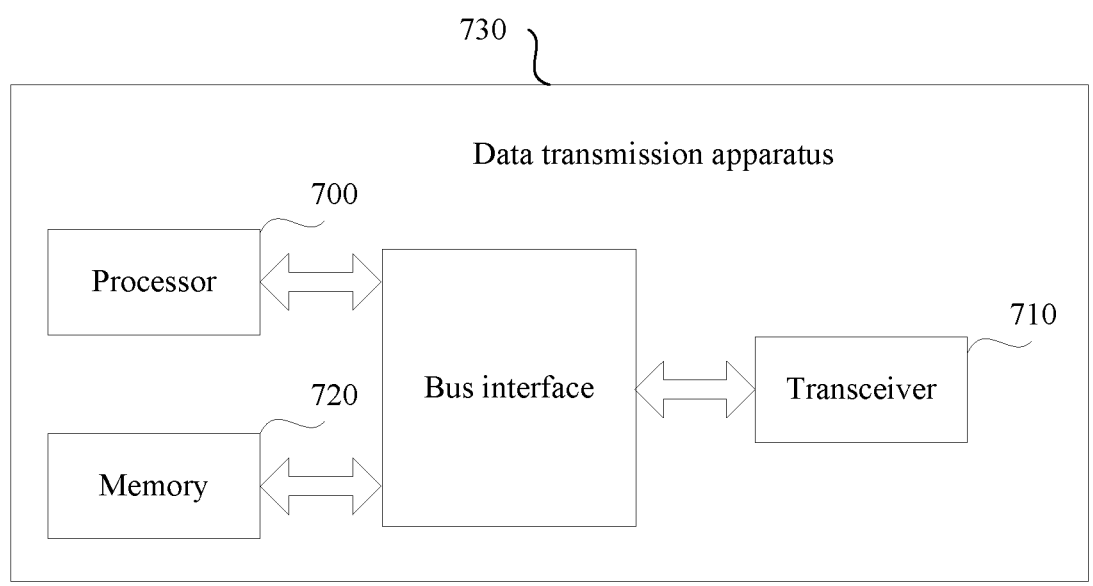
FIG. 7 is a block diagram of another data transmission apparatus according to an embodiment of the present invention.

FIG. 7 shows an example of a block diagram of a data transmission apparatus according to an embodiment of the present invention.

Based on a similar conception, this embodiment of the present invention provides a data transmission apparatus 730 configured to perform the foregoing method procedure, and the apparatus 730 includes a processor 700, a transceiver 710, and a memory 720.

The transceiver is configured to receive a compressed column sent by a data node DN, where the compressed column is obtained by compression by the DN using a compression algorithm corresponding to column.

The processor is configured to read a program in the memory and perform the following processes:

determining the compression algorithm corresponding to the column; and decompressing the compressed column using a decompression algorithm corresponding to the compression algorithm, so as to obtain the column.

Optionally, the processor is configured to:

obtain, through an external interface, the compression algorithm that is entered by a user and that is corresponding to the column; or receive indication information that is sent by the DN and that is used to indicate the compression algorithm corresponding to the column, and determine the compression algorithm according to the indication information.

Optionally, the target node is a DN or a coordinator node CN.

It may be learned from the foregoing content that, in this embodiment of the present invention, a DN determines a column that has a distribution rule, e.g., the distribution rule of parameters in the column; the DN determines, according to a data type of the parameters of the column and the distribution rule of the parameters in the column, a compression algorithm corresponding to the column; the DN compresses the column using the compression algorithm; and the DN sends a compressed column to a target node. Because the DN determines, according to the data type of the parameters of the column and the distribution rule of the parameters in the column, the compression algorithm corresponding to the column, the column can be compressed using, as much as possible, a compression algorithm that can reach a relatively large compression ratio, and a compression algorithm can be determined more flexibly. Further, because the DN compresses the column using the determined compression algorithm and then sends the compressed column to the target node, overheads for data transmission between nodes are reduced and network load is lightened by transmitting compressed data.

A person skilled in the art should understand that the embodiments of the present invention may be provided as a method, or a computer program product. Therefore, the present invention may use a form of hardware only embodiments, software only embodiments, or embodiments with a combination of software and hardware. Moreover, the present invention may use a form of a computer program product that is implemented on one or more computer-usable storage media (including but not limited to a disk memory, a CD-ROM, an optical memory, and the like) that include computer-usable program code.

The present invention is described with reference to the flowcharts and/or block diagrams of the method, the device (system), and the computer program product according to the embodiments of the present invention. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Although some embodiments of the present invention have been described, a person skilled in the art can make changes and modifications to these embodiments once they learn the basic inventive concept. Therefore, the following claims are intended to be construed as to cover the embodiments and all changes and modifications falling within the scope of the present invention.

Obviously, a person skilled in the art can make various modifications and variations to the present invention without departing from the scope of the present invention. The present invention is intended to cover these modifications and variations provided that they fall within the scope of protection defined by the following claims and their equivalent technologies.

What is claimed is:

1. A data transmission method, comprising:
    finding, by a data node (DN) according to a received query command, data that matches one or more keywords comprised in the query command; and
    determining, by a data node (DN), a column corresponding to the keywords from the data, wherein the column comprises multiple parameters, values of at least two parameters in the multiple parameters are equal;
    determining, by the DN according to a data type of the parameters of the column and a distribution rule of the parameters in the column, a compression algorithm corresponding to the column;
    compressing, by the DN, data of the column using the compression algorithm; and
    sending, by the DN, a compressed column to a target node;
    wherein the determined compression algorithm corresponding to the column is a run-length encoding (RLE)

compression algorithm when the data type of the parameters of the column is a data type that supports the RLE compression algorithm; and the determined compression algorithm corresponding to the column is a dictionary compression algorithm when the data type of the parameters of the column is a data type that supports the dictionary compression algorithm.

2. The method according to claim 1, further comprising:
sending, by the DN, indication information to the target node; wherein
the indication information is used to indicate the compression algorithm corresponding to the column, and the indication information is used by the target node to decompress the compressed data to obtain the data.

3. The method according to claim 1, further comprising:
sorting, by the DN according to values of the parameters of the column and on a row-by-row basis, N-row data corresponding to the column, wherein the parameters in the column are in a one-to-one correspondence with rows of the N-row data; wherein
when the data type of the parameters of the column is a data type that supports the RLE compression algorithm and the distribution rule of the column is sorted according to the values of the parameters of the column, the compression algorithm corresponding to the column is the RLE compression algorithm.

4. The method according to claim 1, further comprising:
determining, by the DN according to values of the parameters of the column, parameters whose values are equal from the parameters of the column; and
arranging together, by the DN, multiple-row data corresponding to the determined multiple parameters whose values are equal, wherein the parameters in the column are in a one-to-one correspondence with rows of N-row data; wherein
when the data type of the parameters of the column is a data type that supports the RLE compression algorithm and the distribution rule of the column is arranged together the multiple-row data corresponding to the determined multiple parameters whose values are equal, the compression algorithm corresponding to the column is the RLE compression algorithm.

5. A data transmission apparatus, comprising:
a processor, a transceiver, and a memory coupled to the processor, wherein the memory is configured to store an computer-readable program, and the processor is configured to execute the program, so as to:
find, according to a received query command, data that matches one or more keywords comprised in the query command; and
determine a column corresponding to the keywords from the data, wherein the column comprises multiple parameters, values of at least two parameters in the multiple parameters are equal;
determine, according to a data type of the parameters of the column and a distribution rule of the parameters in the column, a compression algorithm corresponding to the column, and
compress data of the column using the compression algorithm; and
the transceiver is configured to send, under control of the processor, the compressed column to a target node;
wherein the determined compression algorithm corresponding to the column is a run-length encoding (RLE) compression algorithm when the data type of the parameters of the column is a data type that supports the RLE compression algorithm; and the determined compression algorithm corresponding to the column is a dictionary compression algorithm when the data type of the parameters of the column is a data type that supports the dictionary compression algorithm.

6. The apparatus according to claim 5 wherein the transceiver is further configured to:
send indication information to the target node, wherein the indication information is used to indicate the compression algorithm corresponding to the column, and the indication information is used by the target node to decompress the compressed data to obtain the data.

7. The apparatus according to claim 5, wherein the processor is further configured to:
sort according to values of the parameters of the column and on a row-by-row basis, N-row data corresponding to the column, wherein the parameters in the column are in a one-to-one correspondence with rows of the N-row data; and
wherein when the data type of the parameters of the column is a data type that supports the RLE compression algorithm and the distribution rule of the column is sorted according to the values of the parameters of the column, the compression algorithm corresponding to the column is the RLE compression algorithm.

8. The apparatus according to claim 5, wherein the processor is further configured to:
determine according to values of the parameters of the column, parameters whose values are equal from the parameters of the column;
arrange together multiple-row data corresponding to the determined multiple parameters whose values are equal, wherein the parameters in the column are in a one-to-one correspondence with rows of N-row data; and
wherein when the data type of the parameters of the column is a data type that supports the RLE compression algorithm and the distribution rule of the column is arranged together the multiple-row data corresponding to the determined multiple parameters whose values are equal, the compression algorithm corresponding to the column is the RLE compression algorithm.

9. A non-transitory computer-readable medium storing computer instructions for data transmission, which when executed by one or more processors, cause the one or more processors to perform a method, the method comprising:
finding, according to a received query command, data that matches one or more keywords comprised in the query command; and
determining a column corresponding to the keywords from the data;
determining, according to a data type of the parameters of the column and a distribution rule of the parameters in the column, a compression algorithm corresponding to the column;
compressing data of the column using the compression algorithm; and
sending a compressed data of the column to a target node;
wherein the determined compression algorithm corresponding to the column is a run length encoding (RLE) compression algorithm when the data type of the parameters of the column is a data type that supports the RLE compression algorithm; and the determined compression algorithm corresponding to the column is a dictionary compression algorithm when the data type of the parameters of the column is a data type that supports the dictionary compression algorithm.

10. The computer-readable medium according to claim 9, wherein the method further comprises:
sending, by the DN, indication information to the target node, wherein
the indication information is used to indicate the compression algorithm corresponding to the column, and the indication information is used by the target node to decompress the compressed data to obtain the data.

11. The computer-readable medium according to claim 9, wherein method further comprises:
sorting, according to values of the parameters of the columns and on a row-by-row basis, N-row data corresponding to the column, wherein the parameters in the column are in a one-to-one correspondence with rows of the N-row data; wherein when the data type of the parameters of the column is a data type that supports the RLE compression algorithm and the distribution rule of the column is sorted according to the values of the parameters of the column, the compression algorithm corresponding to the column is the RLE compression algorithm.

* * * * *